United States Patent [19]

Mihara

[11] Patent Number: 4,972,239
[45] Date of Patent: Nov. 20, 1990

[54] CONDUCTIVITY MODULATED MOSFET

[75] Inventor: Teruyoshi Mihara, Yokosuka, Japan

[73] Assignee: Nissan Motor Company Limited, Yokohama, Japan

[21] Appl. No.: 368,098

[22] Filed: Jun. 19, 1989

Related U.S. Application Data

[63] Continuation of Ser. No. 119,453, Nov. 10, 1987, abandoned.

[30] Foreign Application Priority Data

Nov. 17, 1986 [JP] Japan .................. 61-272041

[51] Int. Cl.$^5$ ............................. H01L 29/78
[52] U.S. Cl. .................... 357/23.4; 357/59; 357/91; 357/64
[58] Field of Search ............... 357/23.4, 91, 59, 64

[56] References Cited

U.S. PATENT DOCUMENTS

| 4,259,683 | 3/1981 | Adler et al. | 357/64 |
| 4,364,073 | 12/1982 | Becke et al. | 357/23 |
| 4,620,211 | 10/1986 | Baliga | 357/23.4 |
| 4,639,761 | 1/1987 | Singer | 357/23.4 |
| 4,680,604 | 7/1987 | Nakagawa | 357/23.4 |
| 4,684,413 | 8/1987 | Goodman | 357/23.4 |

FOREIGN PATENT DOCUMENTS 60-51700 3/1985 Japan .
61-216363 9/1986 Japan .

OTHER PUBLICATIONS

A. Mogro–Campero et al., "Shorter Turn–Off Times in Insulated Gate Transistors by Proton Implantation", IEEE Electron Device Letters, vol. EDL-6, No. 5, May 85, pp. 244–226.

Primary Examiner—Andrew J. James
Assistant Examiner—Mark Prenty
Attorney, Agent, or Firm—Foley & Lardner, Schwartz, Jeffery, Schwaab, Mack, Blumenthal & Evans

[57] ABSTRACT

A conductivity modulated MOSFET is composed of a p+ anode layer, a second n base layer formed on the anode layer for reducing the device's on resistance by conductivity modulation due to holes injected from the anode layer, an n type doped recombination layer such as an n type doped polycrystalline silicon layer formed on the second base layer for preventing latch-up by promoting recombination of holes with electrons, a first n base layer formed on the recombination layer for serving virtually as a drain, a p channel region formed in the first base layer, an n+ source region formed in the channel region, and an insulated gate electrode.

13 Claims, 7 Drawing Sheets

CONDUCTIVITY MODULATED MOSFET

This application is a continuation, of application Ser. No. 07/119,453, filed Nov. 10, 1987 and now abandoned.

CROSS REFERENCES TO RELATED APPLICATIONS

The following, commonly assigned, U.S. applications relate to subject matter similar to that of the present invention. (1) Ser. No. 022,967 filed on Mar. 6, 1987 and now abandoned, (2) Ser. No. 064,852, filed on June 22, 1987 and now U.S. Pat. No. 4805008, (3) Ser. No. 063,116, filed on June 17, 1987 and now U.S. Pat. No. 4862223, (4) Ser. No. 060,224, filed on June 10, 1987 and now U.S. Pat. No. 4823172, and (5) Ser. No. 081,391, filed on Aug. 4, 1987 and now U.S. Pat. No. 4922317.

BACKGROUND OF THE INVENTION

The present invention relates to conductivity modulated MOSFETs, and contemplates improvements in latch-up prevention and reduction of on resistance.

One conventional example which is disclosed in a U.S. Pat. No. 4,364,073 is shown in FIG. 9. As shown in FIG. 9, a conductivity modulated MOSFET device of this example includes a p+ anode region 21 for supplying holes to be injected, and an n base region 22 serving virtually as a drain. Between the anode region 21 and the n base region 22, there is formed an n+ buffer layer 23 for controlling the efficiency of hole injection.

In a topside of the n base region 22, at least one pair of a p channel region 26 and an n+ source region 27 are formed by DSA (Diffusion Self Alignment) technique. An insulated gate is formed on the surface of the channel region 26 between the n+ source region 27 and the n base region 22. The insulated gate includes a gate insulating oxide film 28 formed on the semiconductor surface and a gate electrode 29 formed on the oxide film 28.

A source electrode 33 is connected with the source region 27 and the channel region 26, and an anode electrode 34 is formed on a bottom of the anode region 21.

Application of a required positive voltage to the anode electrode 34, and a gate voltage above a threshold voltage to the gate electrode 29 changes a channel portion 26a which is a surface layer of the channel region 26 just below the gate electrode 29, into a conducting state, in which, electrons flow from the n+ source region 27 through the channel portion 26a into the n base region 22. On the other hand, a great number of holes (minority carriers) are injected from the p+ anode region 21 into the n base region 22. The buffer layer 23 controls the efficiency of this hole injection.

In the n base region 22, some of the injected holes disappear by recombining with electrons conveyed through the channel portion 26a, but other holes flow into the channel region 26 and reach the source electrode 33. Nevertheless, a large quantity of carriers is accumulated in the n base region 22, so that the conductivity is modulated or increased, and the on resistance is dramatically reduced.

Thus, the conductivity modulated MOSFET is characterized by its very low on resistance and high withstand voltage.

However, in the conductivity modulatd MOSFET, there are formed a parasitic pnp transistor $Q_1$ and a parasitic npn transistor $Q_2$, which are connected to form a pnpn thyristor, as shown in an equivalent circuit of FIG. 10. A resistance Rb is a base resistance of the transistor $Q_2$, which is formed in the channel region 26.

In this structure, a voltage drop Ib·Rb is developed across the resistance Rb by the flow of a current Ib due to the holes which are injected from the p+ anode region 21 equivalent to the emitter of $Q_1$ and reaches the channel region 26 equivalent to the collector of $Q_1$. If this voltage drop exceeds a base threshold voltage (0.6 V) of $Q_2$, then the transistor $Q_2$ turns on, and increases its collector current, i.e., a base current of the transistor $Q_1$. Consequently, the current Ib which is a collector current of $Q_1$ is increased, and a base current of $Q_2$ is increased. In this way, a positive feedback loop is formed, and the device falls into latch-up, which cannot be cancelled until interruption of the power supply.

In order to prevent such a latch-up, it is important to decrease the resistance Rb formed in the channel region 26, and the current Ib flowing through Rb.

In conventional conductivity modulated MOSFETs, therefore, the efficiency of the hole injection is decreased by forming the n+ buffer layer 23 adjacent to the p+ anode region, or the current amplifications of the parasitic transistors $Q_1$ and $Q_2$ are degraded by introducing a lifetime killer into the substrate by Au diffusion or irradiation with electrons.

However, it is not possible to sufficiently reduce the on resistance when the hole injection efficiency is decreased, and the lifetime killer is distributed over the entirety of the substrate, so that there is a tendency to affect the fundamental operation of the MOSFET, and it becomes difficult to control the gate threshold voltage at a predetermined value in the fabrication process.

SUMMARY OF THE INVENTION

It is an object of the present invention to provide a conductivity modulated MOSFET device which has a superior capability of withstanding latch-up and a sufficiently low on resistance, and which can improve the yield in the fabrication process.

According to the present invention, a conductivity modulated MOSFET device comprises a high concentration region of a first conductivity type, a conductivity modulation region of a second conductivity type, a first base region of the second type, a channel region of the first type, a source region of the second type, and a gate electrode. In the illustrated embodiments of the invention, the first conductivity type is the p type, and the second conductivity type is the n type.

The conductivity modulation region is formed on the high concentration region for experiencing conductivity modulation due to minority carriers injected from the high concentration region and enhancing recombination of the minority carriers with majority carriers.

The first base region is formed on the conductivity modulation region, and serves virtually as a drain. The channel region is formed in a surface of the first base region, and the source region is formed in the channel region. The gate electrode is formed on the channel region lying between the source region and the first base region, but the gate electrode is insulated from the semiconductor surface by a gate insulating layer interposed between the gate electrode and the semiconductor surface.

In the illustrated embodiments, the conductivity modulation region comprises a second base region of the second conductivity type formed on the high concentration region for receiving the minority carriers injected from the high concentration region, and a recombination region, such as a n-type doped polycrystalline silicon layer, formed on the second base region for restraining injection of the minority carriers into the first base region.

DETAILED DESCRIPTION OF THE INVENTION

A first embodiment of the present invention is shown in FIGS. 1–4B.

Figure 1:
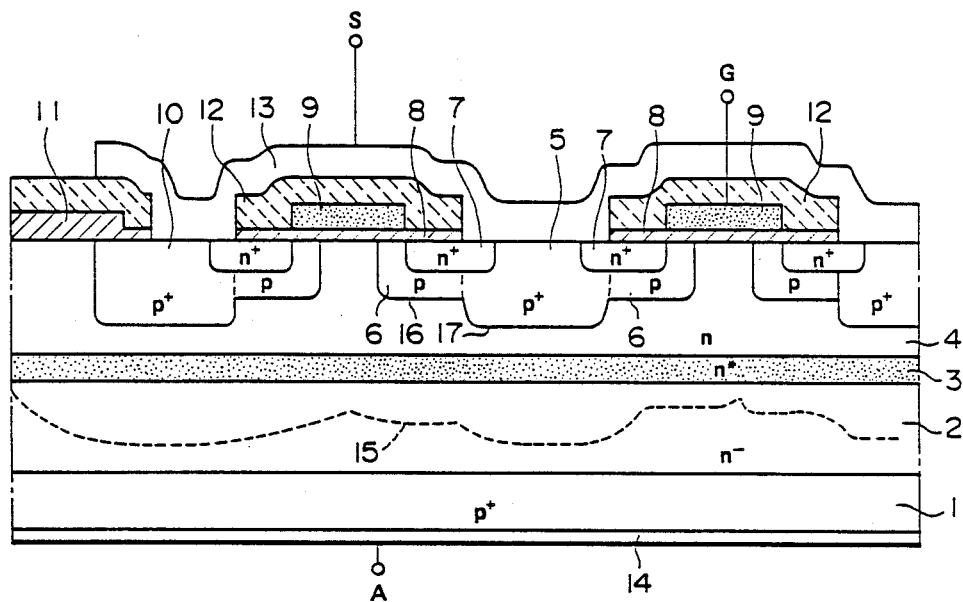
FIG. 1 is a vertical sectional view showing a conductivity modulated MOSFET device of a first embodiment of the present invention.

FIG. 1 shows the structure of a conductivity modulated MOSFET device of the first embodiment. The device of FIG. 1 includes a p+-type anode layer (a high impurity concentration layer) 1 serving as a source of holes, and an n-type second base layer 2 formed on the p+ anode layer 1. The conductivity of the second base layer 2 is modulated by holes (minority carriers) injected from the p+ anode layer 1. The device further includes an n-type first base layer 4 formed above the second base layer 2. The first n base layer 4 serves in effect as a drain. In order to reduce the on resistance, the impurity concentration of the first n base layer 4 is made higher than that of the second n base layer 2, and the thickness of the first n base layer 4 is made as small as possible.

Between the second n base layer 2 and the first n base layer 4, there is formed a recombination layer 3 for restraining hole injection into the first n base layer 4. In this embodiment, an n* polycrystalline silicon layer is used as the recombination layer 3. The polycrystalline silicon has a great number of traps in grain boundaries. Therefore, holes readily recombine with electrons in the recombination layer 3 of the n* polycrystalline silicon.

It is desirable to decrease the thickness of the recombination layer 3 to decrease the on resistance. However, it is necessary to make the recombination layer thickness equal to or greater than about 100 A (angstrom) in order to prevent tunneling of holes and ensure efficient recombination of holes.

Instead of the polycrystalline silicon layer, it is optional to use, as the recombination layer 3, an ion implanted crystal damage layer obtained by bombarding ions, such as O+, Si+ and N+, which are low in diffusion rate and tend to make traps in the crystal lattice of the target material.

The device of FIG. 1 further includes at least one group of a p+ well region 5 for reducing a base resistance Rb of a parasitic transistor, a p-type channel region 6 and an n+ source region 7. These regions 5, 6 and 7 are formed in an upper part of the first n base layer 4, and a top surface of the first n base layer 4 is selectively occupied by these regions 5, 6 and 7. A gate electrode 9 is formed above the channel region 6 interposed between the source region 7 and the first n base region 4, and insulated from the channel region 6 by a gate oxide layer 8.

There are further formed a p+ guard ring 10, a field oxide film 11 and an interlayer insulating film 12 formed by deposition of PSG. A topside source electrode 13 is connected with the channel region 6 through the n+ source region 7 and the p+ well region 5. A bottom anode or drain electrode 14 is formed on the bottom of the anode layer 1.

FIGS. 2A–2H show one example of a process for fabricating the semiconductor device of FIG. 1.

Figure 2A:
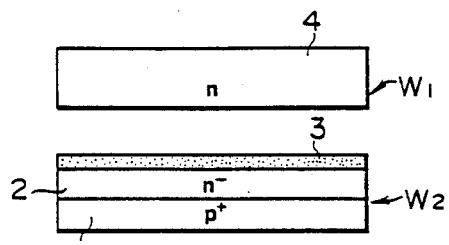
FIGS. 2A–2H are views showing a process for fabricating the device of FIG. 1.

At a step shown in FIG. 2A, a (100)-oriented silicon wafer $W_2$ having a resistivity 100 $\Omega$cm, and a thickness of 200 $\mu$m is prepared. A part of the silicon wafer $W_2$ becomes the second n base layer 2. Then, the p+ anode layer 1 is formed by diffusion in the bottom of the silicon wafer $W_2$ so that the p+ anode layer 1 has a surface concentration of $1 \times 10^{20}$ cm$^{-3}$, and a depth of approximately 10 $\mu$m. On the other hand, the recombination layer 3 is formed by growing an n-type doped polycrystalline silicon layer on the top surface of the wafer $W_2$. The impurity concentration of the n-type doped polycrystalline silicon layer 3 of this example is $1 \times 10^{18}$ cm$^{-3}$, and its thickness is approximately 100 A (angstroms). Furthermore, another silicon wafer $W_1$ which becomes the first n base layer 4 is prepared. For example, the silicon wafer $W_1$ is (100)-oriented, and 1 $\Omega$cm in resistivity and 380 $\mu$m in thickness.

Figure 2B:
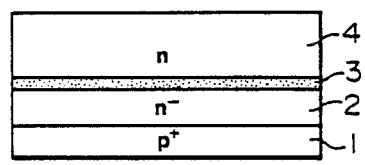

At the step of FIG. 2B, the silicon wafers $W_1$ and $W_2$ are directly bonded together by overlapping both wafers after boiling both wafers in $H_2SO_4$ to make the silicon surfaces hydrophilic, and heating the overlapped wafers at a temperature equal to or higher than 1000° C.

The process for bonding silicon wafers is known (Japanese patent provisional publication No. 60-51700).

Figure 2C:
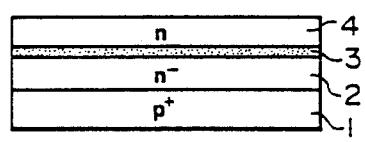

At the step of FIG. 2C, the thickness of the first n base layer 4 of the united silicon chip is reduced to 10 to 20 $\mu$m by griding or other methods.

Figure 2D:
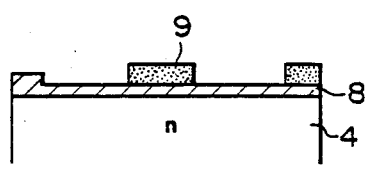

At the step of FIG. 2D, the field oxide film 11 is formed on the first n base layer 4 by growing an $SiO_2$ layer to a thickness of 6000 A by oxidation of the surface of the first n base layer 4. Then, at least one hole is opened at a predetermined position in this $SiO_2$ layer by photoetching, and the gate insulating film 8 is formed in this hole by growing an $SiO_2$ layer to a thickness of about 1000 A in the hole. Thereafter, the gate electrode 9 is formed by depositing a polycrystalline silicon layer of a predetermined thickness on the gate insulating film 8 and removing unnecessary parts by photoetching.

Figure 2E:
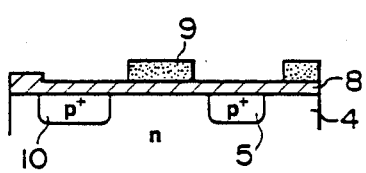

At the step of FIG. 2E, the p+ well region 5 and the p+ guard ring 10 are selectively formed by ion implantation and diffusion so that the surface concentration is $1 \times 10^{20}$ cm$^{-3}$ and the depth is 5 μm.

Figure 2F:
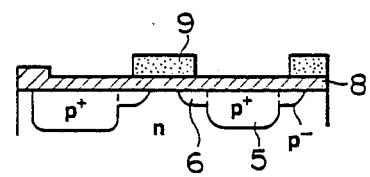

At the step of FIG. 2F, the channel region 6 is formed by ion implantation of boron (B+) and diffusion by using the gate electrode 9 as a mask. The surface concentration of the channel region 6 is $1 \times 10^{17}$ cm$^{-3}$, and the depth is about 3 μm.

Figure 2G:
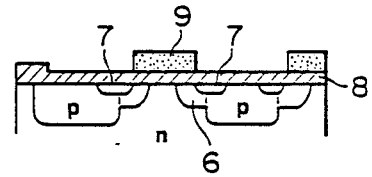

At the step of FIG. 2G, the n+ source region 7 is formed by ion implantation of phosphorus (p+) or arsenic (As+) and diffusion by using the gate electrode 9 as a mask.

Figure 2H:
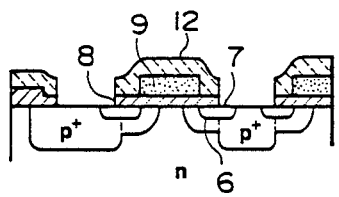

At the step of FIG. 2H, the interlayer insulating film 12 is formed by depositing PSG over the gate electrode 9. Then, after a contact hole is opened by photoetching, the source electrode 13 is formed by an Al film.

Figure 2I:
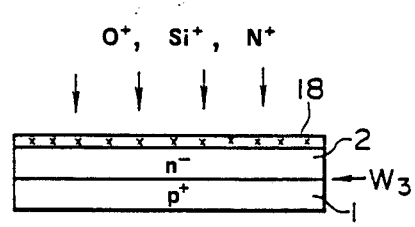
FIGS. 2I and 2J are views showing silicon wafers each of which can be used in place of a silicon wafer $W_2$ shown in FIG. 2A.

When an ion implanted crystal damage layer is employed as the recombination layer 3 instead of the polycrystalline silicon layer, a silicon wafer W₃ shown in FIG. 2I is used at the step of FIG. 2A instead of the wafer W₂. The wafer W₃ has the crystal damage layer 18 having many lattice defects produced by implanting ions such as O+, Si+ or N+ at a sufficiently high dose into the surface of the second n base layer 2. In this ion implantation, the elements O, Si and N are desirable because they are so difficult to diffuse that no trouble is caused in the following heat treatments. However, it is possible to use other elements which are low in diffusion rate.

Figure 2J:
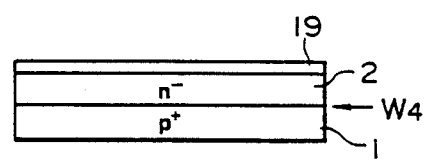

FIG. 2J shows still another silicon wafer W₄ which can be used instead of the wafer W₂. The silicon wafer W₄ has an amorphous silicon layer 19 deposited on the surface of the second n base layer 2. During the later heat treatment, the layer 19 changes from the amorphous form to the polycrystalline form. Therefore, the recombination layer 3 formed from the wafer W₄ is the same as the recombination layer obtained from the wafer W₂.

The semiconductor device of FIG. 1 is operated as follows:

When a predetermined positive voltage is applied to the anode electrode 14, and a gate voltage equal to or higher than a threshold voltage is applied to the gate electrode 9, then a surface layer (channel) of the channel region 6 immediately below the gate electrode 9 is inverted, and the path between the n+ source region 7 and the first n base layer 4 becomes conductive.

On the other hand, a large number of holes (minority carriers) are injected from the p+ anode layer 1 into the second n base layer 2. The injected holes modulate the conductivity of the second n base layer 2 and the resistance of the second n base layer 2 is sufficiently reduced.

Some of the holes diffuse through the second n base layer 2 and reach the recombination layer 3. In the recombination layer 3, the holes are caught by the traps existing abundantly in that layer, and disappear by recombining with electrons. Thus, the recombination layer 3 restrains passage of holes to the first n base layer 4, and prevents inflow of holes into the channel region 6.

Figure 3:
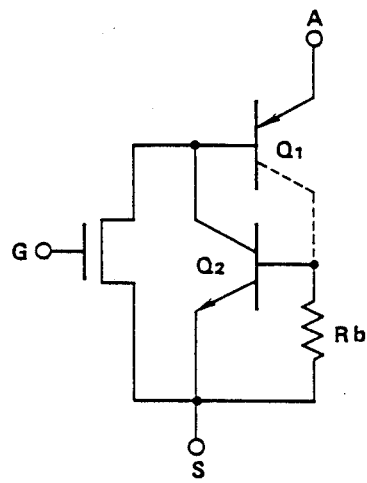
FIG. 3 is a diagram of an equivalent circuit of the device of FIG. 1, for showing an interconnection of parasitic transistors formed in the device.

Accordingly, as shown in an equivalent circuit of FIG. 3, the collector of the parasitic pnp transistor Q₁ is disconnected from the base of the parasitic npn transistor Q₂, so that the parasitic thyristor structure is broken. Because of this and partly because of reduction of the base resistance Rb due to the p+ well region 5, the conductivity modulated MOSFET device of this embodiment is freed of latch-up.

The device's on resistance during operation is mainly constituted by the resistances of the second n base layer 2, the first n base layer 4 and the channel region 6. Among them, the resistance of the second n base layer 2 is sufficiently reduced by the conductivity modulation. Therefore, the device's on resistance is governed by the resistances of the first n base layer 4 and the channel region 6.

Figure 4A:
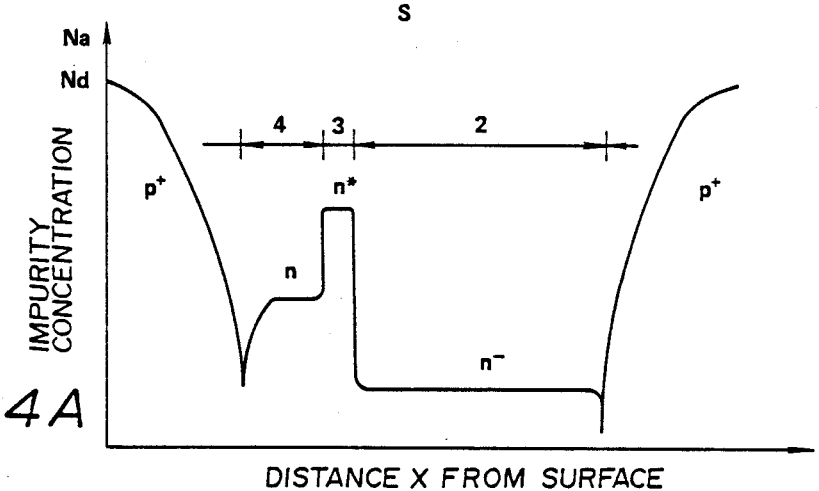
FIGS. 4A and 4B are graphs showing impurity concentration distribution and electric field distribution in the device of FIG. 1, respectively.

In this embodiment, therefore, the first n base layer 4 is made as thin as possible, and higher in impurity concentration than the second n base layer 2. FIG. 4A shows one example of an impurity concentration profile for the device of this embodiment. In FIG. 4A, numerals 2, 3 and 4 denote the layers 2, 3 and 4 of the device, respectively.

The withstand voltage can be appropriately determined by choosing an appropriate form of the impurity concentration profile of the second n base layer 2, the recombination layer 3 and the first n base layer 4.

In order to reduce the on resistance and at the same time to increase the withstand voltage, it is helpful to increase the impurity concentration of the first n base layer 4, and decrease the impurity concentration of the second n base layer 2.

In the first n base layer 4, depletion regions extend from the neighboring channel regions 6 and bring about a pinch-off state, and the field of the channel is weakened. Therefore, the actual withstand voltage is determined by the point at which the field is the highest in the bulk.

Figure 4B:
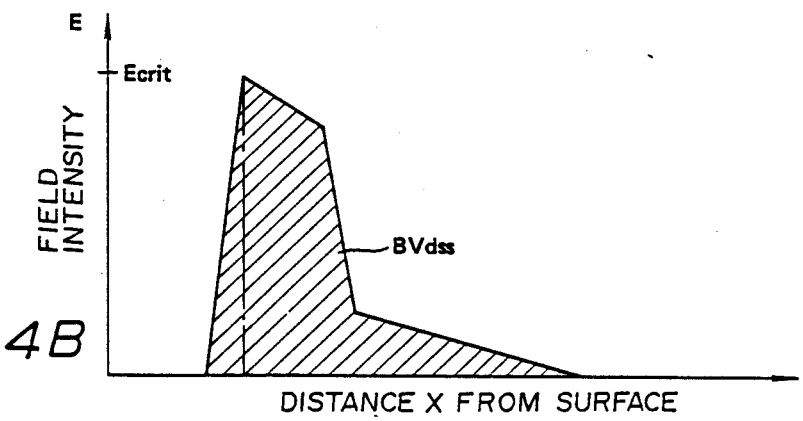

FIG. 4B shows one example of an electric field distribution in the bulk. The withstand voltage is a voltage applied when the field reaches a critical value Ecrit of avalanche breakdown, and the withstand voltage is determined by an area shown in FIG. 4B.

The field distribution of FIG. 4B is expressed by the following Poisson's equation;

$$E = \int_W^X (\rho/\varepsilon s) \, dX \quad (1)$$

where W is the position of an end of a depletion region, and ρ(rho) is an impurity concentration. Therefore, although the impurity concentrations of the first n base layer 4 and the recombination layer 3 are high, it is possible to mitigate the electric field and increase the withstand voltage by decreasing the impurity concentration of the second n base layer 2 so that a depletion region 15 extends therein.

The device of this embodiment offers the following advantages.

Figure 9:
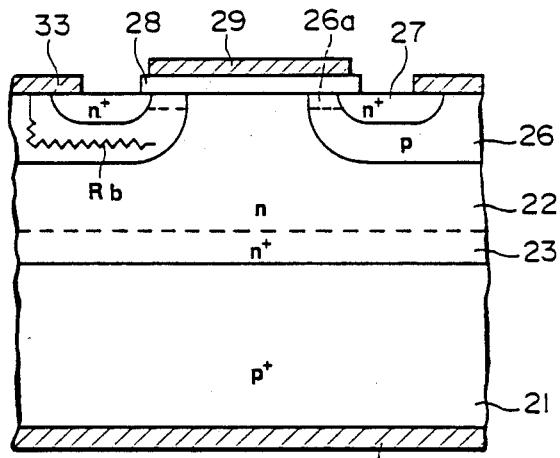
FIG. 9 is a vertical sectional view showing a conventional conductivity modulated MOSFET.
Figure 10:
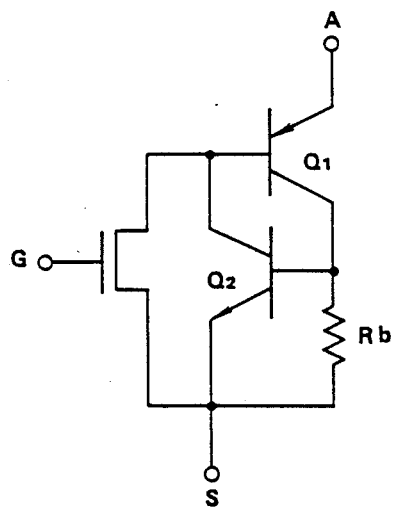
FIG. 10 is a circuit diagram showing an equivalent circuit of the conventional device of FIG. 9.

(A) In contrast to the conventional device of FIG. 9, the structure of this embodiment imposes no restraint on the hole injection from the p+ anode layer 1 into the second n base layer 2, so that the structure can modulate the conductivity and reduce the on resistance sufficiently.

(B) The recombination layer 3 serves to trap the minority carriers and to prevent the inflow of the minority carriers into the channel region 6, so that latch-up is prevented.

(C) The device of this embodiment eliminates the necessity of introducing a lifetime killer into the substrate. Therefore, the gate threshold voltage becomes stable, and the yield in fabrication is improved.

A second embodiment of the present invention is shown in FIGS. 5–8B.

Figure 5:
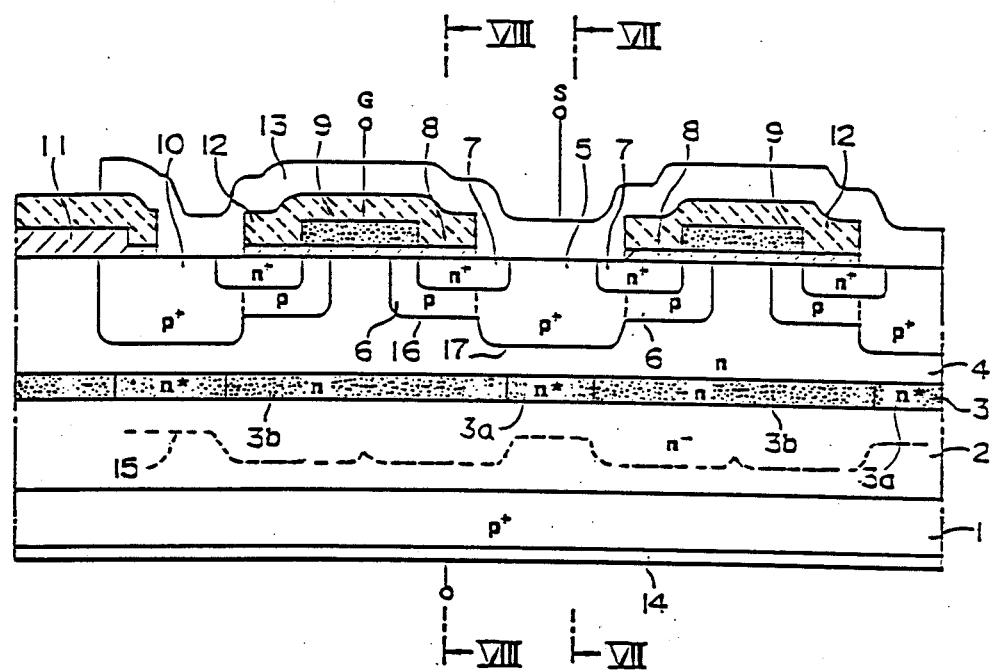
FIG. 5 is a vertical sectional view showing a conductivity modulated MOSFET device of a second embodiment of the present invention.

A MOSFET device of FIG. 5 is basically identical in structure to the device of FIG. 1, but different only in the recombination layer 3. The recombination layer 3 of the second embodiment has at least one high impurity concentration region 3a lying immediately below the bottom of the p+ well region 5, and at least one low impurity concentration region 3b surrounding the high concentration region 3a. In the second embodiment, the capability of withstanding breakdown is improved by making the impurity concentration of the portion 3a of the recombination layer 3 immediately below the bottom of p+ well region 5 higher than that of the surrounding portion 3b.

The low concentration region 3b is doped substantially to the same level as the recombination layer 3 of the first embodiment. That is, the impurity concentration of the low concentration region 3b is set at an appropriate value within a range suitable for restraining holes (minority carriers) from moving into the first n base layer 4 by inducing recombination of the holes.

The device of the second embodiment can be fabricated by the same process as the first embodiment. The high concentration region 3a is formed by ion implantation or other methods before the step of FIG. 2B for joining the silicon wafers W₁ and W₂ (or W₃ or W₄).

In some cases, the device of the first embodiment is unsatisfactory in the following point. As shown in FIG. 1, the p+ well region 5 is deeper than the p channel region 6. That is, the n side (the first n base layer 4) of the pn junction 16 between the channel region 6 and the first n base region 4 is thicker than the n side (the first n base layer 4) of the p+n junction 17 between the p+ well region 5 and the first n base layer 4. Accordingly, the electric field produced at the pn junction 16 having the thicker n side tends to become higher than the electric field produced at the junction 17, and this tendency is increased as the impurity concentration of the first n base layer 4 is increased. As a result, the pn junction 16 tends to suffer avalanche breakdown due to application of a high voltage surge from a load such as an inductance load. When the avalanche breakdown occurs at the pn junction 16, a current flows through the channel region 6 having a high resistance, and this turns on the parasitic npn transistor Q₂ shown in FIG. 3, so that there is a possibility that the device is permanently destroyed because of secondary breakdown.

In the device of the second embodiment, the high concentration region 3a is formed in the recombination layer 3 immediately below the low resistance p+ well region 5 to make the electric field higher at the p+n junction 17 that at the pn junction 16.

When a high voltage surge is applied to the thus constructed device, the avalanche breakdown occurs first at the p+n junction 17, and its current does not flow through the channel region 6. Therefore, the structure of the second embodiment can prevent the permanent destruction of the device due to secondary breakdown.

In the second embodiment, the high concentration region 3a is formed in a wide area confronting the p+n junction 17, so that the current carrying capacity is increased, and the magnitude of resistances in series is decreased. Therefore, the conductivity modulated MOSFET device of the second embodiment is superior in its capability of withstanding breakdown due to a high voltage surge.

Figure 6:
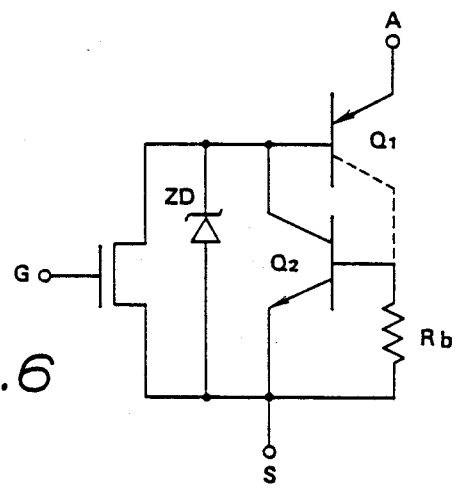
FIG. 6 is a circuit diagram showing an equivalent circuit of the device of FIG. 5.

FIG. 6 shows an equivalent circuit of the device shown in FIG. 5. As shown in FIG. 6, a Zener diode ZD formed by the p+n junction 17 is connected in parallel with the parasitic npn transistor Q₂. The breakdown voltage of the p+n junction 17, that is, the Zener voltage of the Zener diode ZD, is controlled by the impurity concentration of the high concentration region 3a.

Figure 7A:
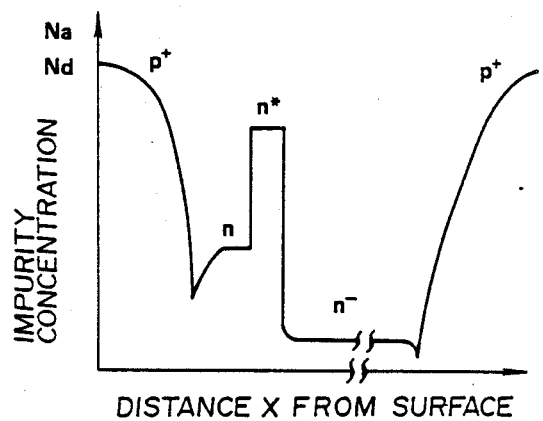
FIGS. 7A and 7B are graphs showing, respectively, impurity concentration distribution and electric field distribution along a line VII—VII of FIG. 5.
Figure 7B:
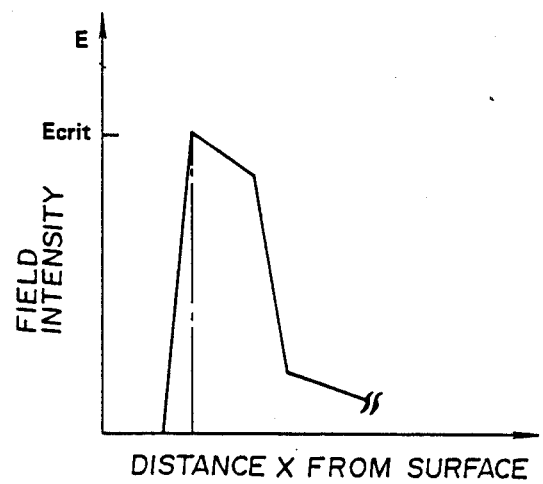
Figure 8:
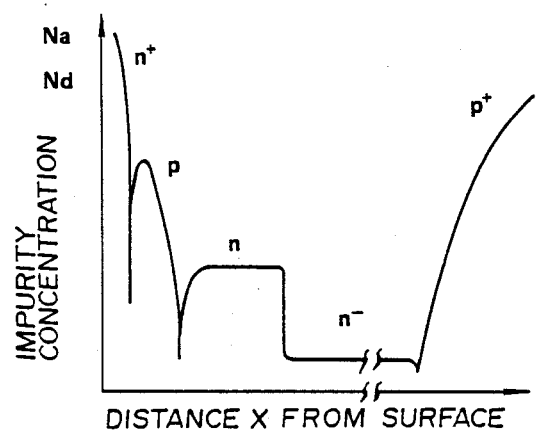
FIGS. 8A and 8B are graphs showing, respectively, impurity concentration distriution and electric field distribution along a line VIII—VIII.
Figure 8:
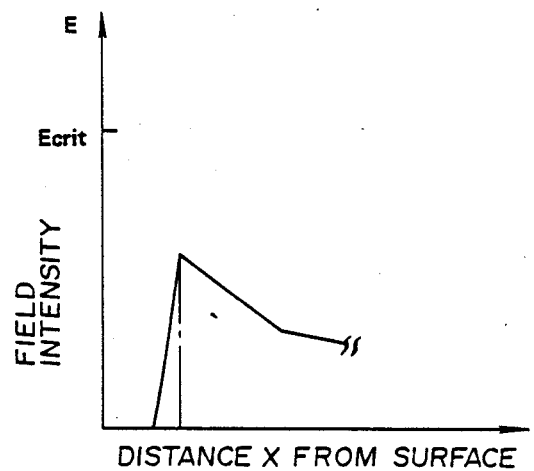

The impurity concentration profiles and the electric field distributions of the device of FIG. 5 are shown in FIGS. 7A, 7B, 8A and 8B. FIGS. 7A and 7B are graphs taken along a line VII—VII of FIG. 5 which passes through the p+n junction 17, and FIGS. 8A and 8B are graphs taken along a line VIII VIII of FIG. 5 which passes through the pn junction 16.

The electric field set up at the p+n junction 17 is higher than that of the pn junction 16, as known from the comparison between the characteristics of FIGS. 7B and 8B.

Although, in the preceding embodiments, the present invention is applied to the n-channel conductivity modulated MOSFET, the present invention is applicable also to the p-channel conductivity modulated MOSFET. In the latter case, the high concentration layer becomes a cathode.

As explained above the conductivity modulated MOSFET devices according to the present invention have the following advantages. The on resistance is reduced by virtue of conductivity modulation. Latch-up is prevented by recombination of minority carriers. Because latch-up is prevented without adding any lifetime killer to the substrate (especially the surface of the substrate), the product to product variation in the gate threshold voltage is decreased, and the yield is improved. When the deep well region and the high concentration recombination region are formed immediately below the well region, the capability of withstanding secondary breakdown is improved.

What is claimed is:

1. A conductivity modulated vertical MOSFET device comprising;
   a high concentration layer of a first conductivity type, having upper and lower surfaces,
   a bottom drain electrode formed on said lower surface of said high concentration layer,
   a lower base layer of a second conductivity type opposite to said first conductivity type, formed on said upper surface of said high concentration layer for receiving conductivity modulation due to minority carriers injected from said high concentration layer,
   a recombination layer formed on said lower base layer for causing recombination of said minority carriers with majority carriers and restraining passage therethrough of said minority carriers,
   an upper base layer of said second conductivity type formed on said recombination layer for serving virtually as a drain,
   a channel region of said first conductivity type formed in an upper surface of said upper base layer,
   a source region of said second conductivity type formed in said channel region,
   a gate electrode formed on said channel region between said source region and said upper base layer with an interposed gate insulating layer, and
   a top source electrode formed on said source region, wherein said device further comprises a well region of said first conductivity type which adjoins said channel region and which is deeper than said channel region, and said recombination layer comprises a first subregion confronting a bottom of said channel region and a second subregion which confronts a bottom of said well region and has an impurity concentration higher than that of said first subregion.

2. A conductivity modulated vertical MOSFET device comprising;
   a high concentration layer of a first conductivity type, having upper and lower surfaces,
   a bottom drain electrode formed on said lower surface of said high concentration layer,
   a lower base layer of a second conductivity type opposite to said first conductivity type, formed on said upper surface of said high concentration layer for receiving conductivity modulation due to minority carriers injected from said high concentration layer,
   a recombination layer formed on said lower base layer for causing recombination of said minority carriers with majority carriers and restraining passage therethrough of said minority carriers,
   an upper base layer of said second conductivity type formed on said recombination layer for serving virtually as a drain,
   a channel region of said first conductivity type formed in an upper surface of said upper base layer,
   a source region of said second conductivity type formed in said channel region,
   a gate electrode formed on said channel region between said source region and said upper base layer with an interposed gate insulating layer, and
   a top source electrode formed on said source region, wherein
   said upper base layer has an impurity concentration higher than that of said lower base layer.

3. A conductivity modulated vertical MOSFET device comprising;
   a high concentration layer of a first conductivity type, having upper and lower surfaces,
   a bottom drain electrode formed on said lower surface of said high concentration layer,
   a lower base layer of a second conductivity type opposite to said first conductivity type, formed on said upper surface of said high concentration layer for receiving conductivity modulation due to minority carriers injected from said high concentration layer,
   a recombination layer formed on said lower base layer for causing recombination of said minority carriers with majority carriers and restraining passage therethrough of said minority carriers,
   an upper base layer of said second conductivity type formed on said recombination layer for serving virtually as a drain,
   a channel region of said first conductivity type formed in an upper surface of said upper base layer,
   a source region of said second conductivity type formed in said channel region,
   a gate electrode formed on said channel region between said source region and said upper base layer with an interposed gate insulating layer, and
   a top source electrode formed on said source region, wherein
   said recombination layer is a layer having a crystal lattice structure which is more imperfect than that of either of said upper and lower base layers, said high concentration layer and said lower base layer together comprise a first single crystal layer, and said upper base layer comprises a second single crystal layer distinct from said first single crystal layer.

4. A conductivity modulated vertical MOSFET device comprising:
   a high concentration layer of a first conductivity type having upper and lower surfaces;
   a bottom drain electrode formed on said lower surface of said high concentration layer;
   a lower base layer of a second conductivity type opposite to said first conductivity type formed on said upper surface of said high concentration layer for receiving conductivity modulation due to minority carriers injected from said high concentration layer to reduce an on-resistance of said device;
   a recombination layer formed on said lower base layer for causing recombination of said minority carriers with majority carriers and restraining passage therethrough of said minority carriers;
   an upper base layer of said second conductivity type formed on said recombination layer for serving virtually as a drain;
   a channel region of said first conductivity type formed in an upper surface of said upper base layer;
   a source region of said second conductivity type formed in said channel region;
   a gate electrode formed on said channel region between said source region and said upper base layer with an interposed gate insulating layer;
   a top source electrode formed on said source region,
   wherein said recombination layer is separated by said upper base layer from said channel region and further separated by said lower base layer from said high concentration layer; and
   a well region of said first conductivity type which adjoins said channel region and which is deeper than said channel region,
   wherein said recombination layer comprises a first subregion confronting a bottom of said channel region and a second subregion which confronts a bottom of said well region and has an impurity concentration higher than that of said first subregion.

5. A conductivity modulated vertical MOSFET device comprising:
   a high concentration layer of a first conductivity type having upper and lower surfaces;
   a bottom drain electrode formed on said lower surface of said high concentration layer;
   a lower base layer of a second conductivity type opposite to said first conductivity type formed on said upper surface of said high concentration layer for receiving conductivity modulation due to minority carriers injected from said high concentration layer to reduce an on-resistance of said device;
   a recombination layer formed on said lower base layer for causing recombination of said minority carriers with majority carriers and restraining passage therethrough of said minority carriers;
   an upper base layer of said second conductivity type formed on said recombination layer for serving virtually as a drain;

a channel region of said first conductivity type formed in an upper surface of said upper base layer;

a source region of said second conductivity type formed in said channel region;

a gate electrode formed on said channel region between said source region and said upper base layer with an interposed gate insulating layer; and a top source electrode formed on said source region, wherein said recombination layer is separated by said upper base layer from said channel region and further separated by said lower base layer from said high concentration layer and said upper base layer has an impurity concentration higher than that of said lower base layer.

6. A device according to claim 5 wherein a thickness of said upper base layer is smaller than that of said lower base layer.

7. A device according to claim 6 wherein said recombination layer is thinner than said upper base layer.

8. A device according to claim 7 wherein said recombination layer has a thickness of approximately 100 angstroms.

9. A device according to claim 8 wherein said recombination layer is interposed between said upper and lower base layers by bonding a first semiconductor wafer comprising said upper base layer and a second semiconductor wafer comprising said lower base layer and said recombination layer.

10. A device according to claim 9 wherein said recombination layer is a doped polycrystalline silicon layer.

11. A device according to claim 9 wherein said recombination layer is a layer whose crystal lattice structure is damaged by ion implantation.

12. A conductivity modulated vertical MOSFET device comprising:

a high concentration layer of a first conductivity type having upper and lower surfaces;

a bottom drain electrode formed on said lower surface of said high concentration layer;

a lower base layer of a second conductivity type opposite to said first conductivity type formed on said upper surface of said high concentration layer for receiving conductivity modulation due to minority carriers injected from said high concentration layer to reduce an on-resistance of said device;

a recombination layer formed on said lower base layer for causing recombination of said minority carriers with majority carriers and restraining passage therethrough of said minority carriers;

an upper base layer of said second conductivity type formed on said recombination layer for serving virtually as a drain;

a channel region of said first conductivity type formed in an upper surface of said upper base layer;

a source region of said second conductivity type formed in said channel region;

a gate electrode formed on said channel region between said source region and said upper base layer with an interposed gate insulating layer; and a top source electrode formed on said source region, wherein said recombination layer is separated by said upper base layer from said channel region and further separated by said lower base layer from said high concentration layer, said recombination layer is a layer having a crystal lattice structure which is more imperfect than that of either of said upper and lower base layers, said high concentration layer and said lower base layer together comprise a first single crystal layer and said upper base layer comprises a second single crystal layer distinct from said first single crystal layer.

13. A conductivity modulated vertical MOSFET device comprising:

a high concentration layer of a first conductivity type having upper and lower surfaces;

a bottom drain electrode formed on said lower surface of said high concentration layer;

a lower base layer of a second conductivity type opposite to said first conductivity type formed on said upper surface of said high concentration layer for receiving conductivity modulation due to minority carriers injected from said high concentration layer to reduce an on-resistance of said device;

a recombination layer formed on said lower base layer for causing recombination of said minority carriers with majority carriers and restraining passage therethrough of said minority carriers;

an upper base layer of said second conductivity type formed on said recombination layer for serving virtually as a drain;

a channel region of said first conductivity type formed in an upper surface of said upper base layer;

a source region of said second conductivity type formed in said channel region;

a gate electrode formed on said channel region between said source region and said upper base layer with an interposed gate insulating layer; and a top source electrode formed on said source region, wherein said recombination layer is separated by said upper base layer from said channel region and further separated by said lower base layer from said high concentration layer and said upper and lower base layers are distinct monocrystalline layers having crystal lattice structures distinct from each other.

* * * * *